United States Patent [19]
Wight et al.

[11] Patent Number: 6,064,238
[45] Date of Patent: May 16, 2000

[54] LOW AMPLITUDE PEAK DETECTOR

[75] Inventors: Mark Stephen Wight, Ottawa; Stephen H. Brazeau; Ian I. Grant, both of Nepean, all of Canada

[73] Assignee: Nortel Networks Corporation, Montreal, Canada

[21] Appl. No.: 09/175,945

[22] Filed: Oct. 21, 1998

[51] Int. Cl.⁷ .................................................. G01R 19/00
[52] U.S. Cl. ................................ 327/58; 327/59; 327/61
[58] Field of Search .................................... 327/58, 59, 60, 327/61, 62, 90, 346, 336, 341, 345, 354

[56] References Cited

U.S. PATENT DOCUMENTS

| | | | |
|---|---|---|---|
| 3,569,736 | 3/1971 | Tschinkel | 327/350 |
| 3,805,172 | 4/1974 | Barrot | 327/91 |
| 3,846,692 | 11/1974 | Hill | 321/8 R |
| 3,885,168 | 1/1995 | Matsuzaki . | |
| 4,091,329 | 5/1978 | Fletcher et al. | 327/350 |
| 4,362,996 | 12/1982 | Priebe | 327/58 |
| 4,400,633 | 8/1983 | Mouri | 327/61 |
| 4,904,864 | 2/1990 | McCorkle | 327/59 |
| 5,014,013 | 5/1991 | Kotzian | 327/346 |
| 5,120,995 | 6/1992 | Abdi | 327/61 |
| 5,272,394 | 12/1993 | Kirk et al. | 327/58 |
| 5,315,168 | 5/1994 | Norton, Jr. | 327/58 |
| 5,381,052 | 1/1995 | Kolte | 327/60 |
| 5,594,384 | 1/1997 | Carrolle et al. | 324/369 |

OTHER PUBLICATIONS

Communications Circuits; Analysis and Design, Kenneth K. Clarke; Donald T. Hess; Addision–Wesley Publishing, Amplitude Demodulators, 10.5 Broadband Peak Envelope Detector, pp. 498–503, 1971.

Electronic Designer's Handbook, Second Edition; L.J. Giacoletto; R.W. Landee; D.C. Davis; A.P. Albrecht; McGraw–Hill, 1977, pp. 18–11 to 18–17.

*Primary Examiner*—Kenneth B. Wells
*Assistant Examiner*—Hai L. Nguyen
*Attorney, Agent, or Firm*—Gowling, Strathy & Henderson; T. Gary O'Neill

[57] ABSTRACT

It is an object of the invention to provide a peak detector with improved precision for low amplitude AC signals for a broad range of input frequencies. One embodiment of the invention is broadly defined as an AC peak detector for receiving an input signal and a negative DC potential and providing an inverted peak output signal approximating an inverted steady state peak of the input signal, the AC peak detector comprising: a semiconductor junction means for receiving the input signal and the inverted peak output signal, and generating a correction signal proportional to an exponential function of the input signal and the inverted peak output signal; a resistance means for receiving the correction signal and sinking a bias current through the semiconductor junction means to the negative DC potential, such that the current/voltage characteristic of the semiconductor junction remains in an exponential region; and an amplifying means for receiving the correction signal and amplifying and inverting the correction signal to produce the inverted peak output signal, and for sourcing the constant bias current.

22 Claims, 6 Drawing Sheets

LOW AMPLITUDE PEAK DETECTOR

The present invention relates generally to peak detectors, and more specifically, to a peak detector design for low amplitude wideband AC signals.

BACKGROUND OF THE INVENTION

An AC peak detector is a non-linear circuit used to obtain a steady state amplitude at the level of the peak amplitude of an input AC signal. The input signal AC signal need not be a uniform sinusoid, or infinite sum of sinusoids as in a square wave signal, but any signal with approximately complementary positive and negative voltage peaks, $+V_{pk}$ and $-V_{pk}$, such as a data communication signal.

A number of different peak detector designs are known, however, each design has shortcomings which limit the range of operability and performance within that range. In particular, there is a need for peak detectors which detect peaks with amplitudes as low as 50 or even 20 millivolts. The known designs do not demonstrate acceptable performance at such low levels.

Generally, peak detector designs employ a semiconductor junction using one of two models. The first models a semiconductor junction as a solid state switch having finite states of being opened or closed. A peak detector using such a model only allows increases in the peak signal above a stored peak signal level, to close the solid state switch allowing the new peak to be stored. The second models a semiconductor junction as having an exponential relationship between voltage drop and current. A peak detector using this model assumes that peak voltages will dominate current flow through the junction, because the current flow during the peak will be exponentially larger than at other voltages.

Referring to FIG. 1, a peak detector circuit incorporating a diode as a solid state switch is shown. This circuit receives an input signal $V_{in}$, and produces a peak output signal $V_{out}$. A first capacitor C1, is used to couple the AC components of the input signal $V_{in}$ to the peak detector circuit and to block DC components. The resistor R1 offers a termination resistance for the input signal $V_{in}$, to balance with the impedance of the $V_{in}$ signal source.

The diode D1, capacitor C2 and resistor R2 make up the components of the peak detector in this circuit. As noted above, the diode D1 is being employed as a solid state switch. When the potential across the diode D1 exceeds its threshold voltage, it is said to be in forward bias, and will conduct. When the potential difference is less than the threshold voltage, the diode D1 is said to be in reverse bias, and will not conduct.

When an input signal $V_{in}$ has sufficient potential to forward bias diode D1, it conducts, and begins to charge capacitor C2. This capacitor C2 will slowly discharge through resistor R2 if the diode D1 returns to reverse bias. If the input potential $V_{in}$, drops, it will not have the potential to forward bias diode D1, and it will return to reverse bias and not conduct. The output signal $V_{out}$ will be equal to the potential stored in capacitor C2, which will be equal to the peak voltage of $V_{in}$ less the voltage required to forward bias diode D1. In order to compensate for the voltage drop across diode D1, a compensation circuit 10 may be added to increase the output by a corresponding voltage.

The circuit shown in FIG. 1 is not suited to low amplitude input signals because a new peak amplitude must be greater than the stored amplitude by an amplitude equal to the diode threshold voltage, in order to forward bias the diode D1. Even though a compensation circuit may translate the stored peak by the amount of this diode threshold voltage, subsequent peaks will not forward bias the diode D1 unless they exceed the old peak by this threshold amplitude. In general, therefore, this circuit has little use for input signals $V_{in}$ with peak amplitudes less than about 500 mV.

A second peak detector design is shown in FIG. 2a, employing the model of a semiconductor junction as having an exponential relationship between current and voltage. This type of peak detector is suitable for AC input signals with peak amplitudes less than the threshold voltage of the diode.

As in FIG. 1, this circuit receives an input signal $V_{in}$, on capacitor C1 which couples the AC components of the input signal $V_{in}$ to the peak detector circuit and blocks DC components. A constant voltage source $V_{ee}$ and a current limiting resistor R3 ensure that diode D2 is always forward biased, so that it functions as a non-linear element and will not act as a switch as in the circuit of FIG. 1.

This circuit also employs a low pass filter in the form of resistor R4 and capacitor C3 to remove high frequency components from the peak detector output $V_{davg}$. These two components may or may not be used in existing implementations.

The peak output signal $V_{davg}$ of this circuit will not be equal to the peak voltage of the input signal $V_{in}$, but will be equal to the average voltage drop across the diode D2. Because the constant voltage source $V_{ee}$ ensures that diode D2 is always forward biased, the average voltage drop across the diode D2, or $V_{davg}$, will follow the positive peak $+V_{pk}$ of the input signal $V_{in}$.

The non-linear operation of the diode D2 is best described with respect to the graph of diode current $I_d$ versus diode voltage drop $V_d$ exponential curve in FIG. 2b. Assuming this circuit feeds a high impedance device, the current through the diode D2 will be equal to the current through the resistor R3. Following the exponential curve of the diode, the majority of the current through resistor R3 is supplied during the phase when $V_d = V_{davg} + V_{pk}$. The value of $V_{davg} + V_{pk}$, or $V_{offset}$, is constant and independent of $V_{pk}$, therefore the positive peak of the input signal $V_{in}$ can be measured as $V_{offset} - V_{davg} = V_{pk}$.

Although the peak detector design shown in FIGS. 2a and 2b may detect peaks below the diode threshold voltage, it suffers from a number of deficiencies. It is clear from the description above, that this circuit may only feed a high impedance device and also that an additional circuit is required to perform the $V_{offset} - V_{davg} = V_{pk}$ compensation. Known designs of such circuits compromise the linearity and input signal range, and do not solve the problem of offset drift. As well, this circuit does not offer impedance matching with the source of the input signal $V_{in}$.

Other peak detector circuits employ diodes and operational amplifiers as "ideal diodes". These circuits typically employ a diode as a solid state switch, but without requiring the input signal to be greater than the threshold voltage of the diode. However, because these designs require the input signal to pass through the operational amplifier, they are limited to low speed applications within the parameters of the operational amplifier.

There are also peak detector circuits which use operational amplifiers and diodes as switches in a feedback loop. In addition to the speed limitations, these circuits have an "overshoot" problem. When the diode switch becomes reverse biased, it opens the feedback loop, so the operational amplifier no longer receives a feedback signal and "overshoots" its target.

Several attempts have been made to prevent this "overshoot" due to open loop gain by adding additional circuitry. One arrangement is to use a high performance operational amplifier which has a more stable open loop gain, but this is more expensive than a standard operational amplifier, and it only reduces the effect, but does not eliminate it. A second arrangement is to add a clamping circuit to block the overshoot, which requires additional components, and again, reduces the problem but does not eliminate it.

One application of low amplitude peak detectors is in the measurement of signals in fibre optic receivers, but there are a growing number of applications as circuits continue to be designed for lower supply voltages, lower signal levels and higher speed operation. Potential applications include: automatic gain control, signal power measurement, signal loss detection, output driver calibration and signal demodulation.

There is therefore a need for a low cost AC peak detector for low amplitude AC signals over a broad range of frequencies. This design must be provided with consideration for the cost of electrical components, circuit manufacturing and physical board area.

SUMMARY OF THE INVENTION

It is therefore an object of the invention to provide a peak detector with improved precision for low amplitude AC signals for a broad range of input frequencies.

One embodiment of the invention is broadly defined as an AC peak detector for receiving an input signal and a negative DC potential and providing an inverted peak output signal approximating an inverted steady state peak of the input signal, the AC peak detector comprising: a semiconductor junction means for receiving the input signal and the inverted peak output signal, and generating a correction signal proportional to an exponential function of the input signal and the inverted peak output signal; a resistance means for receiving the correction signal and sinking a bias current through the semiconductor junction means to the negative DC potential, such that the current/voltage characteristic of the semiconductor junction remains in an exponential region; and an amplifying means for receiving the correction signal and amplifying and inverting the correction signal to produce the inverted peak output signal, and for sourcing the constant bias current.

BRIEF DESCRIPTION OF THE DRAWINGS

These and other features of the invention will become more apparent from the following description in which reference is made to the appended drawings in which.

DETAILED DESCRIPTION OF PREFERRED EMBODIMENTS OF THE INVENTION

Figure 3:
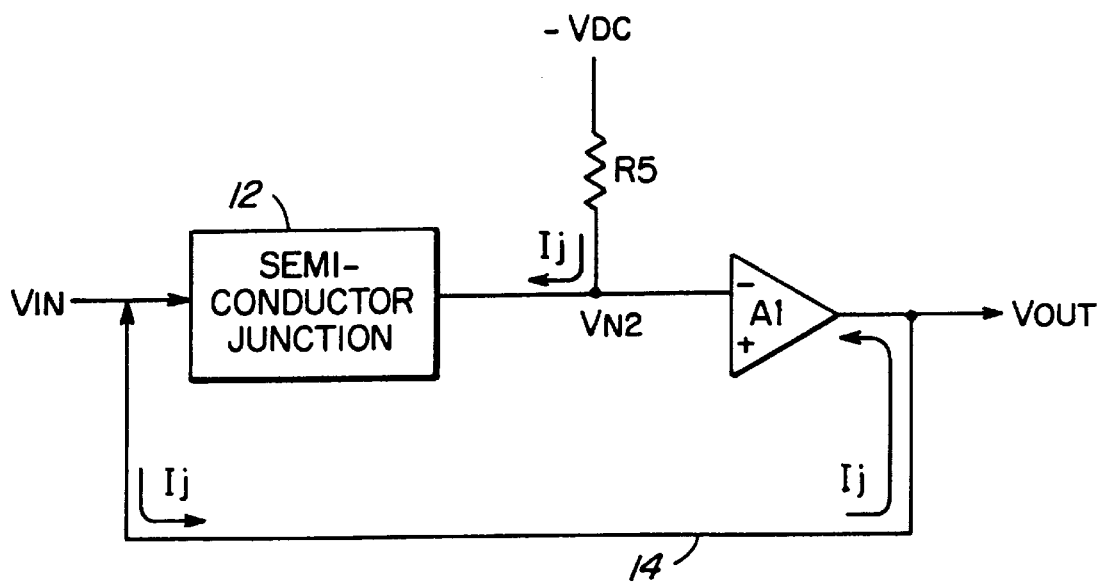
FIG. 3 is a block diagram of a low amplitude peak detector in an embodiment of the invention.

A circuit which addresses the objects outlined above, is presented as a block diagram in FIG. 3. This figure presents an AC peak detector for receiving an input signal $V_{in}$ and a negative DC potential $-V_{DC}$, and providing an inverted peak output signal $V_{out}$, which approximates the inverted steady state peak of the input signal. This AC peak detector comprises three major components: a semiconductor junction 12 for receiving the input signal $V_{in}$ and the inverted peak output signal $V_{out}$ via a feedback loop 14, and generating a correction signal $V_{N2}$ proportional to an exponential function of the input signal and the inverted peak output signal; a resistance R5 for receiving the correction signal $V_{N2}$ and sinking a bias current $I_j$ through the semiconductor junction 12 to the negative DC potential $-V_{DC}$, such that the current/voltage characteristic of the semiconductor junction 12 remains in an exponential region; and an amplifier A1 for receiving the correction signal $V_{N2}$ and amplifying and inverting the correction signal $V_{N2}$ to produce the inverted peak output signal $V_{out}$ and for sourcing the bias current $I_j$.

The operation of the circuit will be described with respect to how it maintains a steady state and then with respect to how it responds to a change in the peak-to-peak voltage of the input signal $V_{in}$ to return to a steady state. The equations will then be developed showing how the output signal $V_{out}$ of the circuit represents the peak voltage of the input signal $V_{in}$.

As shown in FIG. 3, the inverted peak output signal $V_{out}$ is provided directly by the amplifier A1. Because the amplifier output $V_{out}$ is the inverse of the correction signal $V_{N2}$, the feedback loop will try to drive the correction signal $V_{N2}$ to zero volts. How close the correction signal $V_{N2}$ comes to zero volts will be determined by the gain of the amplifier A1. However, if amplifier A1 is implemented as an integrator, as discussed below, the correction signal $V_{N2}$ will be driven to zero volts at the steady state.

When the correction signal $V_{N2}$ is at zero volts, the voltage drop across the resistor will be $-V_{DC}$, and the current $I_j$, through resistor R5 will be equal to $-V_{DC}/R5$. Because the input to amplifier A1 has very high impedance, all of this current $I_j$ must pass through the semiconductor junction 12, and be sourced from the amplifier A1 via the feedback loop 14. Because the input signal $V_{in}$ is an AC signal, it will not source or sink this DC current $I_j$. Therefore, regardless of the amplitude of the input signal $V_{in}$, the average current $I_j$ through the semiconductor junction 12 at steady state will be:

$$\bar{I}_j = \frac{-V_{DC}}{R5} \qquad (1)$$

This current reference can be altered by changing either of the design parameters $-V_{DC}$ or R5 to suit the expected average amplitude of the input signal $V_{in}$. This current reference $I_j$ allows the semiconductor junction 12 to be kept above the saturation current, that is, in forward bias, and within the exponential region of its current/voltage curve.

This steady state will only be maintained while the peak amplitude of $V_{in}$ is constant. Calculations will be discussed below which demonstrate how the signal of feedback loop 14, or $V_{out}$, is the inverse of the peak voltage of the input signal $V_{in}$ plus an offset voltage which may be compensated for if required. It will also be shown that the voltage drop across the semiconductor junction 12 will be dominated by the peak of the AC input voltage $V_{in}$. Therefore, once steady state has been reached, an AC input from $V_{in}$ will be compensated by a DC output from A1 equal to the inverse of the peak of the input signal $V_{in}$ plus an offset voltage.

If the peak-to-peak voltage of the input signal $V_{in}$ now increases from a steady state, the positive peak of the input signal $V_{in}$ will dominate the semiconductor junction 12 forward voltage. This will cause the current $I_j$ through the semiconductor junction 12 to increase. Because all of this current must pass through resistor R5, the voltage drop across resistor R5 must also increase, causing the voltage at node $V_{N2}$ to become greater than zero. A positive voltage at node $V_{N2}$ will cause a positive voltage at the negative input to the amplifier A1, producing a negative output at $V_{out}$. This negative output at $V_{out}$ will return to the semiconductor junction 12 via the feedback loop 14 to balance with the positive peak of the input signal $V_{in}$, returning to the circuit to a steady state of the output voltage $V_{out}$ being equal to the peak of the input voltage $V_{in}$ plus the offset voltage.

Similarly, if the peak-to-peak voltage of the input signal $V_{in}$ now decreases from the steady state, then the new, lower positive peak will dominate the forward voltage of the semiconductor junction 12. This will cause the current $I_j$ through the semiconductor junction 12 to decrease. With the decreased current through semiconductor junction 12, and hence resistor R5, the voltage at node $V_{N2}$ feeding amplifier A1, will drop to less than zero volts. This will cause a lower positive output $V_{out}$ from amplifier A1, returning the bias voltage across the semiconductor junction 12 to its reference level.

In short, the feedback loop 14 causes convergence to the steady state of having the voltage at node $V_{N2}$ essentially at ground potential, or zero volts. This is accomplished when the output $V_{out}$ of amplifier A1 is equal to the peak of the input signal $V_{in}$, because the forward bias of the semiconductor junction 12 is dominated by the positive peak of the input voltage $V_{in}$. This can be shown from the exponential model of a semiconductor junction.

A number of assumptions were made to simplify the calculations, however these assumptions do not restrict the applicability of the invention. For example, the characteristics of semiconductor junctions are known to be temperature dependent. These temperature effects have not been included in the calculations because methods for compensating for these effects will be outlined below. Equations including the temperature terms could be manipulated in the same manner, but would add complexity without increasing the invention information.

The calculations also assume that the input signal $V_{in}$ is a balanced digital input signal with a peak amplitude of $V_{pk}$, ignoring rise and fall time contributions, but again, this assumption does not restrict the applicability of the invention.

The current flow through a semiconductor junction may be modelled as follows:

$$I_j = I_s(e^{V_j/V_t} - 1) \quad (2)$$

or:

$$V_j = V_t\left(\ln\frac{I_j}{I_s} + 1\right) \quad (3)$$

where:

$I_j$=current through the semiconductor junction $V_j$=voltage drop across the semiconductor junction $I_s$=reverse saturation current for the semiconductor junction (constant)

e=inverse natural log (constant)

$V_t$=threshold voltage of the semiconductor junction (constant)

Because the semiconductor junction is a non-linear device, the average current can not be determined by superposition. From equation (2), the average current through the semiconductor junction 12 will be approximately:

$$\bar{I}_j = I_s\left[e^{\bar{V}_j/V_t} \times \frac{1}{2}[e^{+V_p/V_t} + e^{-V_p/V_t}] - 1\right] \quad (4)$$

where: $\bar{I}_j$=the average current through semiconductor junction 12

$\bar{V}_j$=the average voltage drop across semiconductor junction 12

$+V_p$=the positive peak voltage of the input signal $V_{in}$ $-V_p$=the negative peak voltage of the input signal $V_{in}$ Arithmetic expansion of equation (4) yields:

$$\bar{I}_j = \frac{1}{2}I_s e^{(\bar{V}_j+V_p)/V_t} + \frac{1}{2}I_s e^{(\bar{V}_j-V_p)/V_t} - I_s \quad (5)$$

Equation (5) may be solved for $\bar{V}_j$, to provide a general solution, but because of the exponential relationship between diode voltage and current, we may assume that:

$$e^{(\bar{V}_j+V_p)/V_t} \gg e^{(\bar{V}_j-V_p)/V_t} \quad (6)$$

Therefore, we can cancel the second term of equation (5), and solve for $\bar{V}_j$, to determine the average voltage across the semiconductor junction 12:

$$V_j = V_t\ln\left[\frac{2\bar{I}_j + I_s}{I_s} + 1\right] - V_{pk} \quad (7)$$

The natural logarithmic term of equation (7) is the term referred to herein as the voltage offset, $V_x$. Because a compensation circuit incorporating a semiconductor junction will also behave according to equation (3), the natural logarithmic term of equation (7) will be removed if the compensation circuit has a current of $I_x=2I_j+I_s$ through the semiconductor junction, leaving the average voltage drop across the semiconductor junction of the peak detector circuit approximately equal to the peak of the input signal voltage, $-V_{pk}$:

$$\overline{V}_j = -V_{pk} \quad (8)$$

The required current of $I_x = 2I_j + I_s$ through the semiconductor junction of the compensation circuit is obtained by the proper selection of resistor values, which is described in detail hereinafter.

Because the feedback loop 14 holds the voltage at node $V_{N2}$ to approximately zero volts in the steady state, then for the voltage drop across the semiconductor junction to equal $-V_{pk}$, the DC voltage of the feedback loop 14 must be equal to $V_x - V_{pk}$. Note again, that because the input signal $V_{in}$ is an AC signal, its average voltage is zero volts, so it can not contribute to the voltage drop across the semiconductor junction 12. Therefore, the output $V_{out}$ from amplifier A1 is equal to the inverse of the peak input voltage, $V_{pk}$.

Because the semiconductor junction is being used as an exponential operator, and not a switch, the amplitude of the input signal $V_{in}$ does not have to exceed the threshold voltage of the semiconductor junction.

This circuit uses an amplifier A1, but this amplifier is not in the path of the high frequency input signal $V_{in}$. Therefore, performance of the circuit is not limited by the performance of the amplifier A1 as in known circuits.

Figure 1:
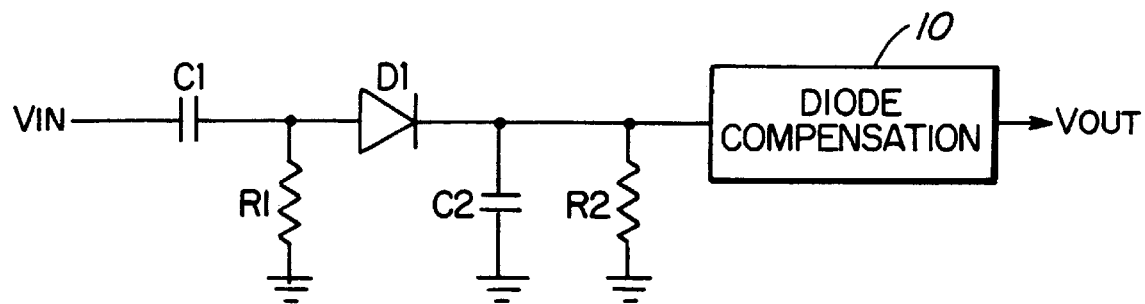
FIG. 1 is a half-wave rectifier peak detector circuit as known in the prior art.
Figure 2A:
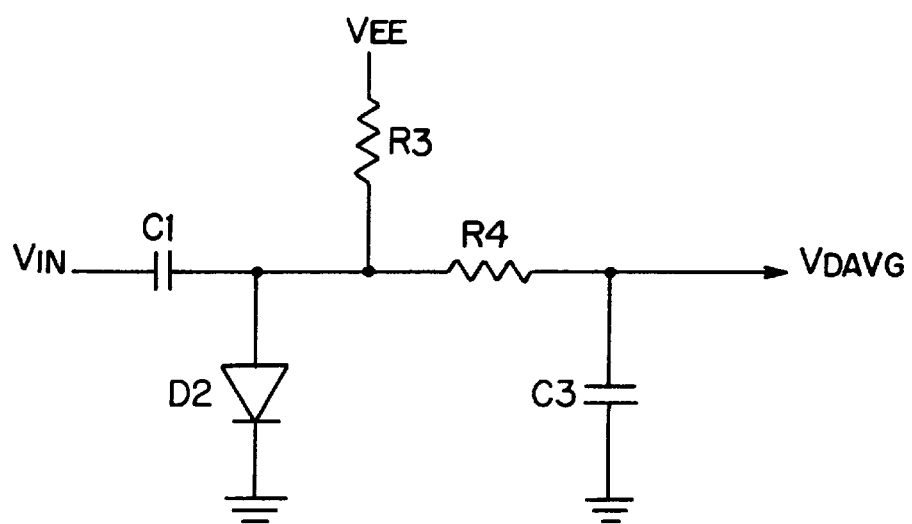
FIG. 2a is an exponential peak detector circuit as known in the prior art.
Figure 2B:
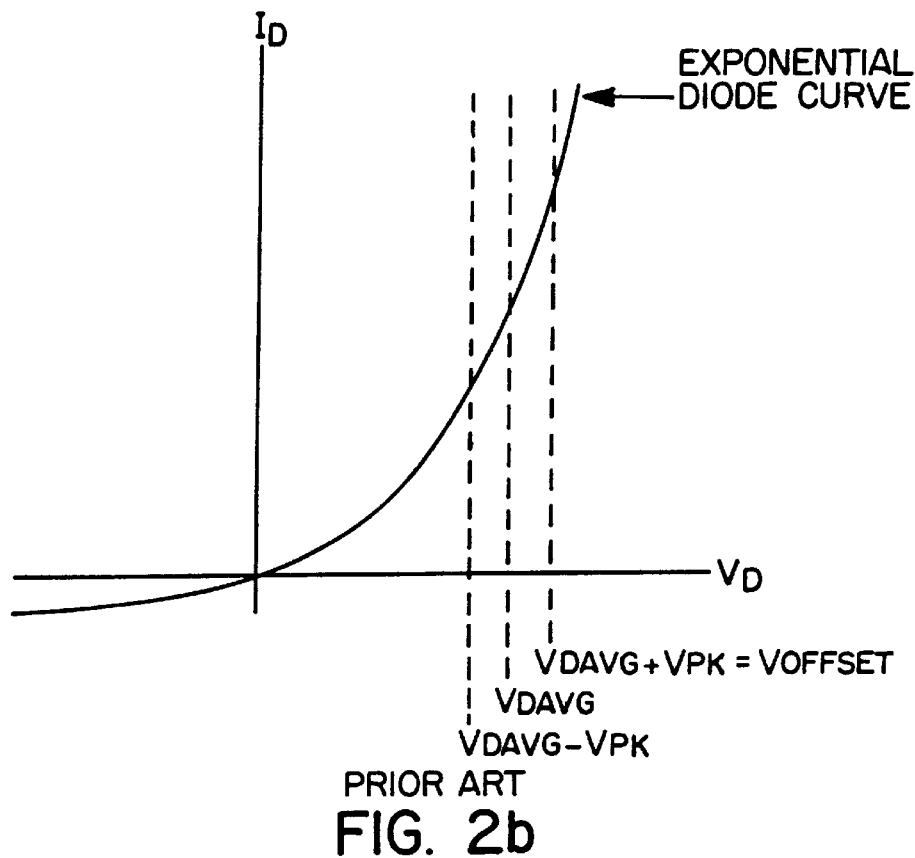
FIG. 2b is a graph of the current versus voltage curve for a diode in an exponential peak detector circuit as known in the prior art.

Further, this design is not restricted as in the circuit of FIG. 2a. There is no restriction as to the impedance of any further circuits due to the isolation of the output amplifier A1. The compensation circuit complements the peak detector circuit without compromising the linearity of the circuit or allowing excessive offset drift. As well, range of input signal frequency and amplitude is broader than the circuit designs known in the art. The invention also may implement impedance matching with the source of the input signal as outlined below.

Although the semiconductor junction 12 is in the feedback loop 14, it is not being used as a switch. The semiconductor junction 12 is always forward biased to some extent, and conducting. Therefore, there is no problem with "overshoot" due to open-loop gain and less costly, lower performance components may be used with better overall circuit performance.

Because this circuit does not have an "overshoot" problem, a clamping circuit is not required. This reduces component count and hence circuit board area, from the circuits known in the art, resulting in decreased costs.

Figure 4:
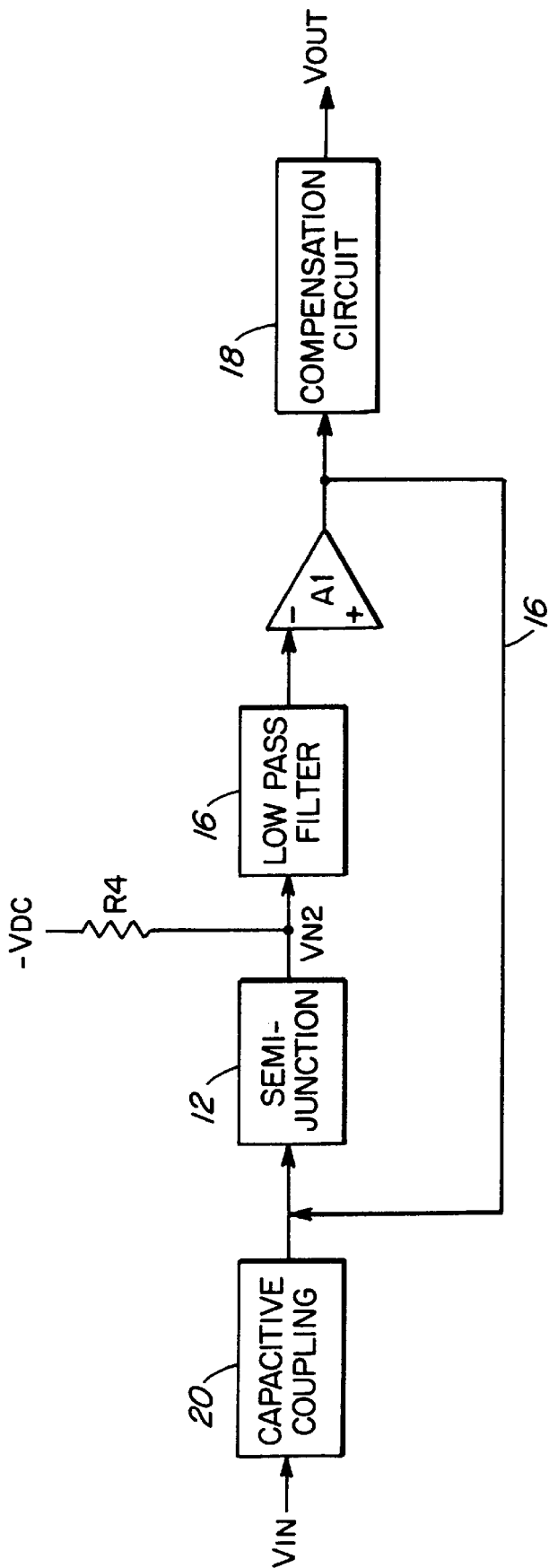
FIG. 4 is a block diagram of a low amplitude peak detector in an embodiment of the invention.

FIG. 4 presents additional embodiments of the invention in block diagram form. These embodiments of the invention are built on the invention outlined with respect to FIG. 3.

If the input signal $V_{in}$ contains any DC components or low frequency AC noise, these components can be blocked by an AC coupling means 20, a high pass filter, or band pass filter, in a number of manners known in the art. In the preferred embodiment, a capacitive coupling will be described which provides a termination resistor coupled to ground. This provides an impedance to balance with the source of the input signal, passing AC components to the peak detector, and blocking DC components.

FIG. 3 was described with respect to a semiconductor junction 12, which could be provided by a diode, a bipolar transistor, or any other semiconductor device which demonstrates an exponential relationship between current and voltage. In fact, the current/voltage relationship need not be strictly exponential, as long as the component allows the peak voltage of the input signal $V_{in}$ to dominate the current flow within the desired operating range.

A low pass filter 16 could be added to provide high frequency stability to the feedback circuit if needed. In its simplest form, this could comprise a single capacitor to ground. Because the input signal $V_{in}$ is AC, this capacitor would short any AC components of the signal at $V_{N2}$ to ground. A skilled technician would be able to apply more sophisticated low pass filters if necessary.

In addition to the low pass filter 16 described above, the amplifier A1 could be replaced with an integrator, to further reduce high frequency oscillations. As noted above, an integrator will improve stability because it will maintain a steady state output equal to the peak, while having an input of zero volts. An amplifier will have to maintain a non-zero volt input in order to maintain a steady output. Furthermore, the integrator will be less affected by noise, but at the expense of taking longer to respond to changes in the input signal $V_{in}$.

Whether an integrator or amplifier is required, and the time factor of the integrator, or gain of the amplifier, depends on the operating parameters of the application. Determining such parameters may be performed by one skilled in the art from the teachings of the invention.

As well, an amplifier or integrator could be provided by either discrete components, such as transistors, or integrated components, such as operational amplifiers.

As noted above, the output of FIG. 3 is a DC voltage equal in magnitude, but opposite in polarity to the positive peak of the input signal $V_{in}$, plus the calculable $V_x$ offset term. In some cases, this inverted uncompensated output signal is all that is required, but the inversion may be corrected and compensation made for voltage drop through the diode by adding a compensation circuit. If the inverted uncompensated output is desired to be equal to the actual peak of the input signal $V_{in}$, and equal in polarity, this translation may be made by a compensation circuit 18.

This output can be translated to the actual polarity of the input peak by biasing a second semiconductor junction against the same $-V_{DC}$ reference. If two like semiconductor junctions are used, and kept at the same temperature, then this will compensate for any temperature effects, or other characteristics of the first semiconductor junction. In the preferred embodiment of the invention described with respect to FIG. 5, a compensation circuit utilizes a diode D4 supplied in the same physical package as the diode D3 of the semiconductor junction 12. Having both diodes in the same physical package reduces the effects due to different ambient temperatures, variations in manufacturing lots or device specifications, and makes tracking of device quality control easier.

Alternatively, two semiconductor junctions could be mounted adjacent one another so that they are exposed to the same ambient temperature, or mounted adjacent one another on a heat sink. If the ambient temperature is not expected to change, such an arrangement may not be required.

Alternatively, the above equations (1)–(7), could be developed including the temperature terms from the semiconductor junction model. The determination could then be made as to how the temperature issue is handled.

Figure 5:
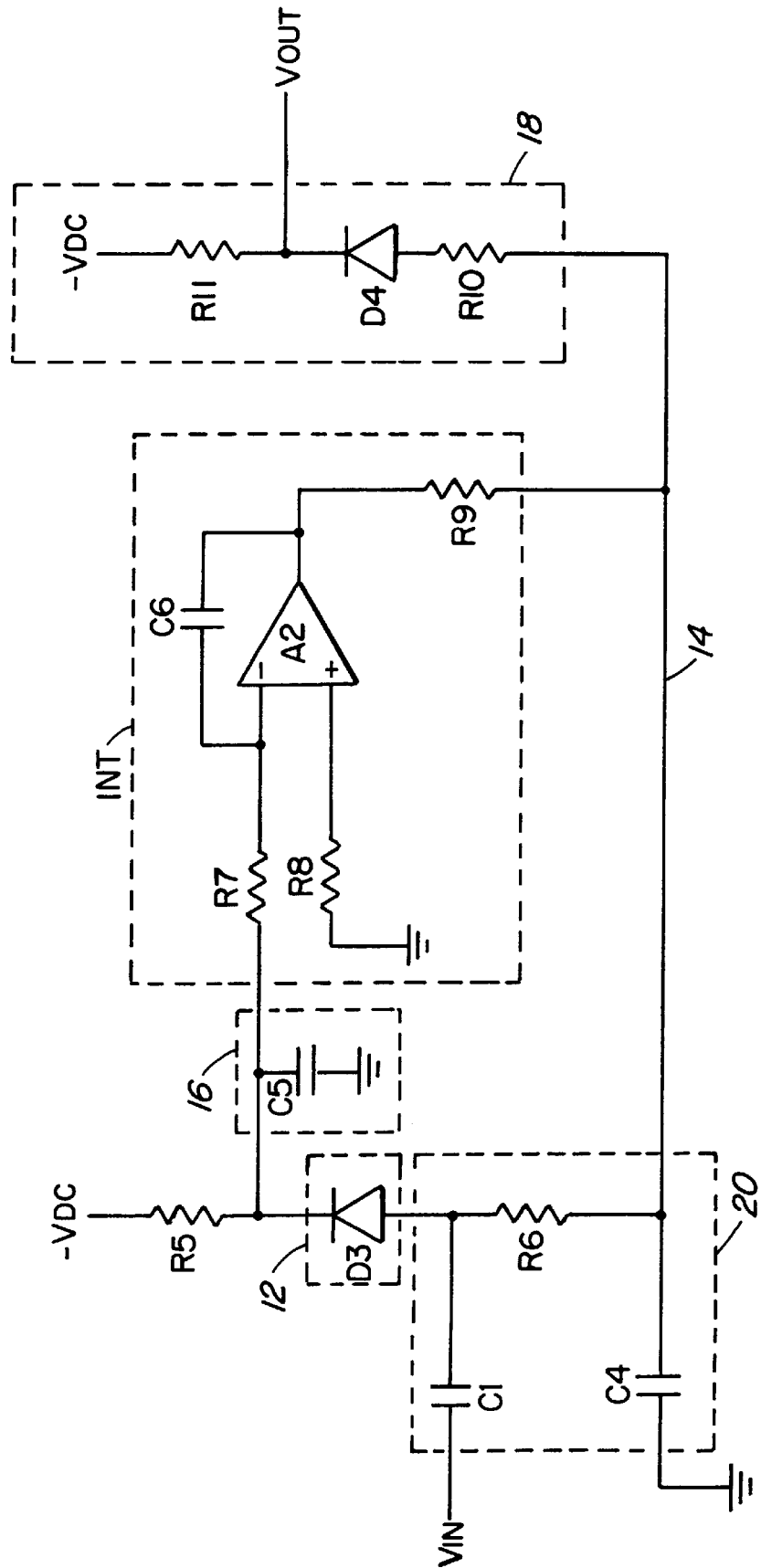
FIG. 5 is an electrical schematic diagram of a low amplitude peak detector in an embodiment of the invention.

FIG. 5 presents an electrical schematic diagram of the preferred embodiment of the AC peak detector.

The circuit includes an AC coupling means 20 comprising two capacitors C1 and C4, and a resistor R6. The two capacitors C1 and C4 block DC components of the input signal $V_{in}$, and allow AC components to pass. These AC components pass through the termination resistor R6, which is selected to balance with the impedance of the source of the $V_{in}$, signal.

The circuit also includes a semiconductor junction 12 in the form of diode D3. The anode of the diode D3 is connected to the input signal $V_{in}$ side of the termination resistance R6. The cathode of diode D3 is connected to resistor R5 which establishes the diode forward bias current $I_j$. The other side of resistor R5 is connected to the constant DC voltage source $-V_{DC}$. The anode of the diode is also connected to a capacitor C5 coupled to ground, which provides a low pass filter 16, passing high frequency signal components to ground.

The anode of the diode D3 is also connected to an input resistor R7 of an integrator INT comprised of three resistors R7, R8 and R9, a capacitor C6 and an operational amplifier A2. The two input resistors R7 and R8 are generally like in value, and connected to negative and positive inputs of the operational amplifier A2. The negative input of the operational amplifier A2 is also connected to the output of the operational amplifier A2 with the capacitor C6. The output of the operational amplifier A2 is connected to resistor R9, which is connected to the termination resistor R6 via the feedback loop 14, and to resistor R10 in the compensation circuit 18.

The compensation circuit 18 consists of two resistors, R10 and R11, and a diode D4, in an arrangement complementary to the input circuit. Resistor R10 is connected to the anode of diode D4, and the cathode provides the compensated output signal $V_{out}$. The cathode is also connected to resistor R11 which is connected to the negative DC voltage source $-V_{DC}$.

Selection of the component values can be determined through calculations and experimental methods known in the art. As well, computer simulation packages may be used to determine component values optimal to certain design criteria such as signal input voltage and frequency. Such software packages could also be used to modify the circuit, or optimise other parameters.

To summarize the selection of component values:

1. resistor R6 is selected to establish an input impedance to match the signal source;
2. capacitors C1 and C4 are selected to block the DC and low frequency AC components that must be blocked, and pass the AC signal that is desired;
3. resistor R5 is selected to establish the steady state forward current through the diode, as per equation (1);
4. resistors R7, R8 and R9, and capacitor C6, are determined by the time constant and gain of the integrator. The calculations of these parameters will vary with the operational amplifier A2 used, whose parameters can be obtained from the manufacturer of the operational amplifier A2; and
5. resistors R10 and R11 will depend on the gain, K, of the diode compensation circuit, which can be varied specific to the application where:
   R10=K×R6₁ and
   R11=K×R5;

as noted above, these selections will generally be made to yield a current of $I^x=2/I_j+I_s$, through the semiconductor junction of the compensation circuit.

Figure 6:
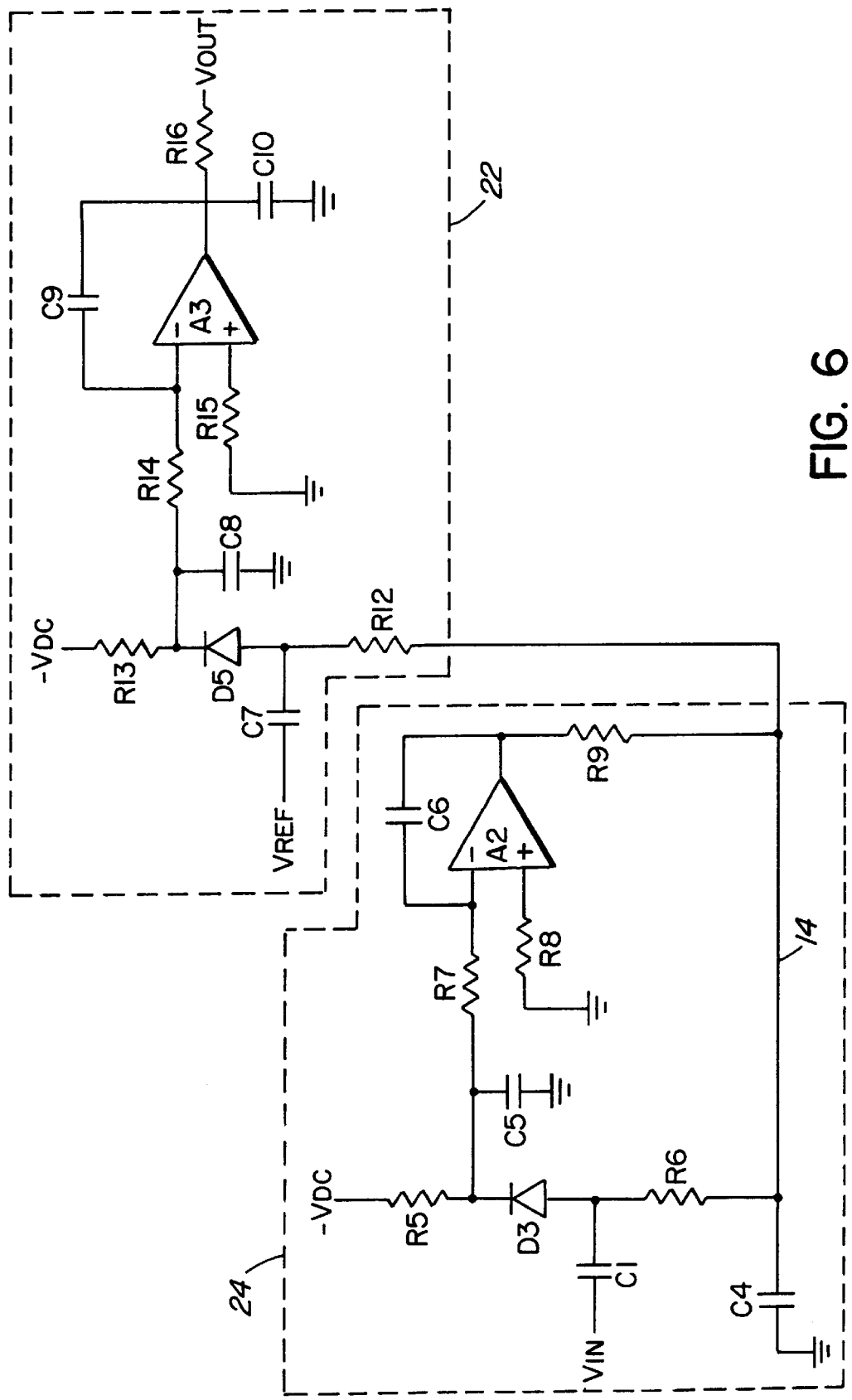
FIG. 6 is an electrical schematic diagram of a low amplitude peak detector with matching diode compensation in an embodiment of the invention.

If more precise compensation is required, the circuit of FIG. 6 could be employed, though at the expense of additional components and board space. This circuit is essentially the same as the circuit in FIG. 5, except that the diode compensation circuit 18 has been replaced with a complementary peak detection circuit 22, cycling at the rate of the $V_{ref}$ AC reference signal. The rationale is that the performance of the complementary circuit 22 will match that of the main peak detection circuit 24, thereby compensating for variations in than just the diode rather than just the diode D3 voltage drop and variations with temperature.

In addition to the components described in the main peak detector circuit 24 with respect to FIG. 5 above, this circuit includes an AC coupling means to receive the $V_{ref}$ signal, comprising two capacitors C7 and C4, and a resistor R12. The two capacitors C7 and C4 block DC components of the input signal $V_{ref}$, and allow AC components to pass. These AC components pass through the termination resistor R12, which is selected to balance with the impedance of the source of the $V_{ref}$ signal.

Also similar to FIG. 5, the compensation circuit 22 includes a semiconductor junction in the form of diode D5. The anode of the diode D5 is connected to the input signal $V_{,,}$ side of the termination resistance R12. The cathode of diode D5 is connected to resistor R13 which establishes the diode forward bias current $I_j$ of the compensation circuit 22. The other side of resistor R13 is connected to the constant DC voltage source $-V_{DC}$. The anode of the diode is also connected to a capacitor C8 coupled to ground, which provides a low pass filter, passing high frequency signal components to ground.

The anode of the diode D5 is also connected to an input resistor R14 of a second integrator comprised of three resistors R14, R15 and R16, a capacitor C9 and an operational amplifier A3. The two input resistors R14 and R15 are generally like in value, and connected to negative and positive inputs of the operational amplifier A3. The negative input of the operational amplifier A3 is also connected to the output of the operational amplifier A3 with the capacitor C9. The output of the operational amplifier A3 is connected to resistor R16, which is connected to the output $V_{out}$; A low pass capacitor C10 is also connected between the operational amplifier A3 output and ground to pass any AC signal components to ground.

The components in the compensation circuit 22 will generally be chosen to be proportional to the corresponding components in the main peak detector circuit 24. The value of the proportions, K', will be selected on the relative tracking rates required. That is, diodes D3 and D5, and operational amplifiers A2 and A3 will generally be of the same make, model and value, while values of components will be paired as follows:

R13=K'×R5
C8=K'×C5
R14=K'×R7
R15=K'×R8
C9=K'×C6
R16=K'×R9

The operation of this compensation circuit 22 is essentially the same as the main peak detector 24 described above, except that in the main peak detector circuit 24, the voltage across the diode D3 varies with the AC voltage of the input signal $V_{in}$, and the circuit tracks it with the DC feedback loop 14. In the compensation circuit 22, the voltage across the diode D5 varies with the DC voltage output of the main peak detector 24 and the AC input voltage from $V_{ref}$ tracks it.

Figure 7:
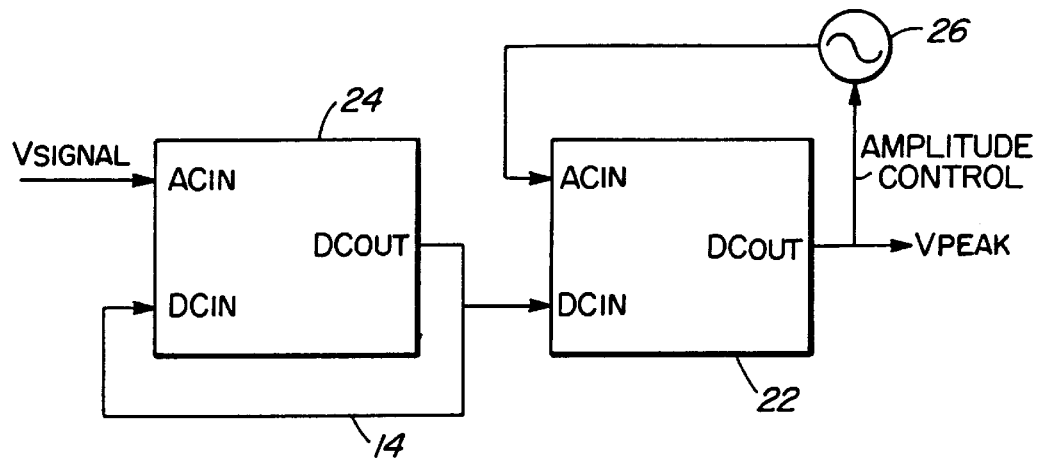
FIG. 7 is a block diagram of how the low amplitude peak detector of FIG. 6 may be implemented in an embodiment of the invention.
Figure 8:
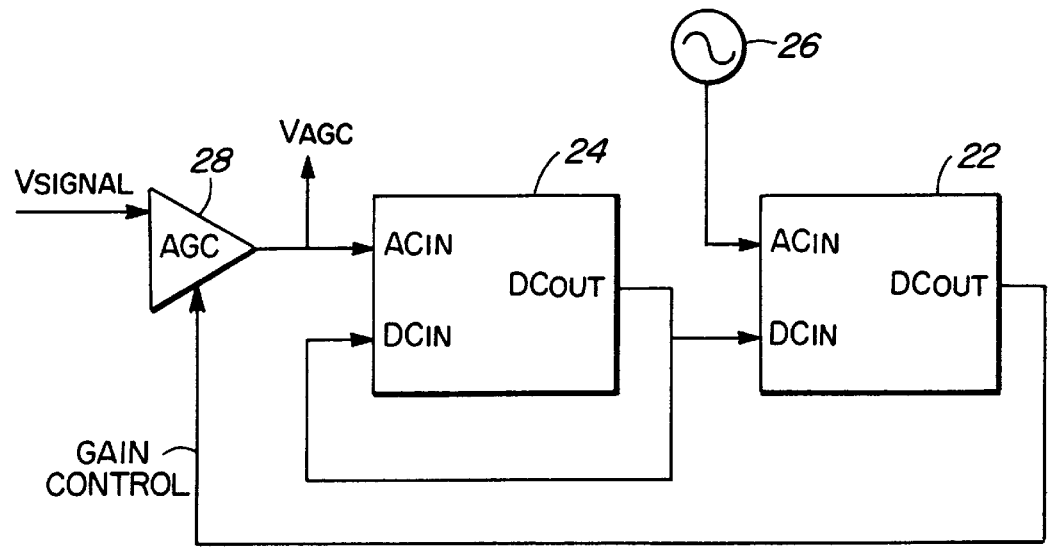
FIG. 8 is a block diagram of a low amplitude peak detector in an embodiment of the invention, applied as a control for an Automatic Gain Control amplifier.

Two different means of implementing a feedback loop to track this DC voltage output from the operational amplifier A2 are presented in FIGS. 7 and 8. In these two figures, the two peak detector circuits 22 and 24 that comprise FIG. 6 have been simplified as blocks, and the inputs and outputs re-labelled to describe the general case. The inputs of the peak detectors labelled $AC_{in}$ in FIGS. 7 and 8 correspond to the respective inputs for the $V_{in}$ and $V_{ref}$ signals shown in FIG. 6. The inputs labelled $DC_{in}$ in FIGS. 7 and 8 correspond to the input of the feedback loop 14 at resistor R6 for the main peak detector circuit 24, and to the input at resistor R12 from resistor R9 for the compensating peak detector circuit 22 shown in FIG. 6. The outputs labelled $DC_{out}$ in FIGS. 7 and 8 correspond to the output from resistor R9 to the resistor R12 for the main peak detector circuit 24, and to the $V_{out}$ signal for the compensating peak detector circuit 22 shown in FIG. 6.

FIG. 7 shows how the blocks may be arranged so that a compensated peak output voltage $V_{peak}$ can be generated from an input signal $V_{signal}$. This is done by feeding the input signal $V_{signal}$ into $AC_{in}$ of the main peak detector circuit 24, and connecting the $DC_{out}$ of the main peak detector circuit 24 to its $DC_{in}$ via the feedback loop 14 in the same manner as shown in FIG. 6. The $DC_{out}$ of the main peak detector circuit 24 output also feeds the $DC_{in}$ of the compensating circuit 22. The $DC_{out}$ of the compensating peak detector circuit 22 controls the amplitude of an AC signal generator 26 which provides the $AC_{in}$ input signal back to the compensating circuit 22.

Operationally, the main peak detector circuit 24 provides an inverted uncompensated peak signal in the manner described above. The compensating circuit 22 will then track this signal by varying the amplitude of the AC reference from the AC signal generator 26 to match that of the $DC_{in}$ signal. The resulting output $V_{peak}$ is a compensated peak signal with the same voltage sense as the original input signal $V_{signal}$. Note that this output signal $V_{peak}$ will be at the frequency of the AC reference from the AC signal generator 26.

The circuit of FIG. 6 may also be applied to an Automatic Gain Control circuit as shown in FIG. 8. The input signal $V_{signal}$ is fed into the amplifier 28 whose gain is controlled by the $DC_{out}$ of the compensating peak detector circuit 22, so that the output of this amplifier 28, $V_{AGC}$, will be the input signal $V_{signal}$ amplified to match the amplitude of the AC reference signal generated by the AC signal generator 26. The arrangement of the two peak detector circuits is essentially the same as described above, except that instead of the $DC_{out}$ of the compensating peak detector circuit 24 being used to control the amplitude of the AC signal generator 26, it is being used to control the amplitude of the $DC_{in}$ input signal to the compensating circuit 22, via the amplifier 28 and the main peak detector circuit 24.

In this manner, the two peak detector circuits 22 and 24 will track the output signal $V_{AGC}$ to match the amplitude of the AC reference signal generated by the AC signal generator 26. If the input signal $V_{signal}$ drops, then the output of the amplifier 28 will drop. This low $AC_{in}$ input signal to the main peak detector 24 causes the inverted output $DC_{out}$ of the main peak detector 24 to drop, and the input $DC_{in}$ to the compensation circuit 22 will also drop. Because the AC reference signal is constant, this low input $DC_{in}$ at the compensation circuit 22 will cause the output $DC_{out}$ to increase, increasing the gain of the amplifier 28.

For the arrangements shown in FIGS. 7 and 8, other circuits which receive an AC input signal and a DC input signal and generate a peak DC output signal proportional to an exponential function of the AC and DC input signals may be used as the peak detector blocks 22 and 24. One skilled in the art would be able to develop similar circuits which may take advantage of the invention in the circuit arrangements shown.

As well, while particular embodiments of the present invention have been shown and described, it is clear that changes and modifications may be made to such embodiments without departing from the true scope and spirit of the invention. For example, the orientation of the diodes and biasing voltages in FIG. 5 could be reversed and still realize the benefits of the invention.

A peak detector in a manner of the invention could be applied to a broad range of applications, including fibre optic receivers, automatic gain control loops, input signal power measurement and signal loss detect, output driver calibration and signal demodulators. Again, such implementations would be clear to one skilled in the art, and does not take away from the invention.

What is claimed is:

1. An AC peak detector for receiving an input signal and a negative DC potential and providing an inverted peak output signal approximating an inverted steady state peak of said input signal, said AC peak detector comprising:

a semiconductor junction means for receiving said input signal and said inverted peak output signal, and generating a correction signal proportional to an exponential function of said input signal and said inverted peak output signal;

a resistance means for receiving said correction signal and sinking a bias current through said semiconductor junction means to said negative DC potential, such that the current/voltage characteristic of said semiconductor junction means remains in an exponential region; and an amplifying means for receiving said correction signal and amplifying and inverting said correction signal to produce said inverted peak output signal, and for sourcing said bias current.

2. An AC peak detector as claimed in claim 1 wherein said amplifying means comprises an integrating means.

3. An AC peak detector as claimed in claim 2 wherein said semiconductor junction means comprises a first diode.

4. An AC peak detector as claimed in claim 3 further comprising a compensation means for receiving said inverted peak output signal and inverting said inverted peak output signal and compensating for the voltage drop across said first diode, to produce a peak output signal approximating a steady state peak of said input signal.

5. An AC peak detector as claimed in claim 4 further comprising a low pass filter means for receiving said correction voltage and coupling high frequency components of said correction voltage to ground.

6. An AC peak detector as claimed in claim 5 wherein said integrating means comprises an operational amplifier.

7. An AC peak detector as claimed in claim 6 further comprising an AC coupling means electrically connected to said semiconductor junction means, impedance matched to the source of said input signal for passing DC components of said input signal to ground.

8. An AC peak detector as claimed in claim 7 wherein said compensation means comprises a second diode.

9. An AC peak detector as claimed in claim 8 wherein said first diode and said second diode are provided in a common device package.

10. An AC peak detector for receiving an input signal and a negative DC potential and providing an inverted peak output signal approximating an inverted steady state peak of said input signal, said AC peak detector comprising:

a first diode for receiving said input signal and said inverted peak output signal, and generating a correction signal proportional to an exponential function of said input signal and said inverted peak output signal;

a resistance means for receiving said correction signal and sinking a bias current through said first diode to said negative DC potential, such that the current/voltage characteristic of said first diode remains in an exponential region; and an integrating means for receiving said correction signal and integrating and inverting said correction signal to produce said inverted peak output signal, and for sourcing said bias current.

11. An AC peak detector as claimed in claim 10 further comprising a compensation means for receiving said inverted peak output signal and inverting said inverted peak output signal and compensating for the voltage drop across said first diode, to produce a peak output signal approximating a steady state peak of said input signal.

12. An AC peak detector as claimed in claim 11 further comprising a low pass filter means for receiving said correction voltage and coupling high frequency components of said correction voltage to ground.

13. An AC peak detector as claimed in claim 12 wherein said integrating means comprises an operational amplifier.

14. An AC peak detector as claimed in claim 13 further comprising an AC coupling means electrically connected to said first diode, impedance matched to the source of said input signal for passing DC components of said input signal to ground.

15. An AC peak detector as claimed in claim 14 wherein said compensation means comprises a second diode.

16. An AC peak detector as claimed in claim 15 wherein said first diode and said second diode are provided in a common device package.

17. An AC peak detector as claimed in claim 16, for receiving an AC reference signal, wherein said compensation means comprises:

said second diode for receiving said AC reference signal and said inverted peak output signal, and generating a compensated correction signal proportional to an exponential function of said AC reference signal and said inverted peak output signal;

a second resistance means for receiving said compensated output signal and sinking a bias current through said second diode to said negative DC potential, such that the current/voltage characteristic of said second diode remains in an exponential region; and a second integrating operational amplifier for receiving said compensated correction signal and amplifying and inverting said correction signal to produce said peak output signal, and for sourcing said bias current.

18. An AC peak detector for receiving an input signal and a negative DC potential and providing an inverted peak output signal approximating an inverted steady state peak of said input signal, said AC peak detector comprising:

an AC coupling means electrically connected to a first diode impedance matched to the source of said input signal for passing DC components of said input signal to ground;

said first diode for receiving said input signal and said inverted peak output signal, and generating a correction signal proportional to an exponential function of said input signal and said inverted peak output signal;

a resistance means for receiving said correction signal and sinking a bias current through said first diode to said negative DC potential, such that the current/voltage characteristic of said semiconductor junction means remains in an exponential region;

an operational amplifier means for receiving said correction signal and integrating and inverting said correction signal to produce said inverted peak output signal, and for sourcing said bias current;

a low pass filter means for receiving said correction voltage and coupling high frequency components of said correction voltage to ground; and a compensation means comprising a second diode for receiving said inverted peak output signal and inverting said inverted peak output signal and compensating for the voltage drop across said first diode, to produce a peak output signal, said first diode and said second diode being provided in a common device package.

19. A compensated AC peak detector for receiving an input signal and providing a compensated peak output signal approximating a steady state peak of said input signal, said AC peak detector comprising:

a first AC peak detector for receiving said input signal and an inverted uncompensated peak output signal, and generating said inverted uncompensated peak output signal proportional to an exponential function of said input signal and said inverted uncompensated peak output signal;

a second AC peak detector for receiving said inverted uncompensated peak output signal and an AC reference signal, and generating a compensated peak output signal proportional to an exponential function of said inverted uncompensated peak output signal and said AC reference signal; and an AC signal generator for receiving said compensated peak output signal and generating said AC reference signal having predetermined frequency and amplitude proportional to amplitude of said compensated peak output signal.

20. A compensated AC peak detector as claimed in claim 19, for receiving a negative DC potential, wherein:

said first peak detector comprises:

a first semiconductor junction means for receiving said input signal and said inverted uncompensated peak output signal, and generating a first correction signal proportional to an exponential function of said input signal and said inverted uncompensated peak output signal;

a first resistance means for receiving said first correction signal and sinking a first bias current through said first semiconductor junction means to said negative DC potential, such that the current/voltage characteristic of said first semiconductor junction means remains in an exponential region; and a first amplifying means for receiving said first correction signal and amplifying and inverting said first correction signal to produce said inverted uncompensated peak output signal, and for sourcing said first bias current; and said second peak detector comprises:

a second semiconductor junction means for receiving said AC reference signal and said inverted uncompensated peak output signal, and generating a second correction signal proportional to an exponential function of said AC reference signal and said inverted uncompensated peak output signal;

a second resistance means for receiving said second correction signal and sinking a second bias current through said second semiconductor junction means to said negative DC potential, such that the current/voltage characteristic of said second semiconductor junction means remains in an exponential region; and a second amplifying means for receiving said second correction signal and amplifying and inverting said second correction signal to produce said compensated peak output signal, and for sourcing said second bias current.

21. An automatic gain control amplifier for receiving an input signal and an AC reference signal of predetermined amplitude and frequency and providing a constant amplitude output signal, said automatic gain control amplifier comprising:

a first amplifier for receiving said input signal and said gain control signal and generating a constant amplitude output signal by amplifying said input signal proportionally to the amplitude of said gain control signal;

a first AC peak detector for receiving said constant amplitude output signal and an inverted uncompensated peak output signal, and generating said inverted uncompensated peak output signal proportional to an exponential function of said constant amplitude output signal and said inverted uncompensated peak output signal; and a second AC peak detector for receiving said inverted uncompensated peak output signal and said AC reference signal, and generating said gain control signal proportional to an exponential function of said inverted uncompensated peak output signal and said AC reference signal.

22. A automatic gain control amplifier as claimed in claim 21, for receiving a negative DC potential, wherein:

said first peak detector comprises:

a first semiconductor junction means for receiving said constant amplitude output signal and said inverted uncompensated peak output signal, and generating a first correction signal proportional to an exponential function of said constant amplitude output signal and said inverted uncompensated peak output signal;

a first resistance means for receiving said first correction signal and sinking a first bias current through said first semiconductor junction means to said negative DC potential, such that the current/voltage characteristic of said first semiconductor junction means remains in an exponential region; and a first amplifying means for receiving said first correction signal and amplifying and inverting said first correction signal to produce said inverted uncompensated peak output signal, and for sourcing said first bias current; and said second peak detector comprises:

a second semiconductor junction means for receiving said AC reference signal and said inverted uncompensated peak output signal, and generating a second correction signal proportional to an exponential function of said AC reference signal and said inverted uncompensated peak output signal;

a second resistance means for receiving said second correction signal and sinking a second bias current through said second semiconductor junction means to said negative DC potential, such that the current/voltage characteristic of said second semiconductor junction means remains in an exponential region; and a second amplifying means for receiving said second correction signal and amplifying and inverting said second correction signal to produce said gain control signal, and for sourcing said second bias current.

\* \* \* \* \*